United States Patent
Wünstel et al.

[11] Patent Number: 5,148,439
[45] Date of Patent: Sep. 15, 1992

[54] SEMICONDUCTOR LASER

[75] Inventors: Klaus Wünstel, Schwieberdingen; Reinold Weinmann, Esslingen, both of Fed. Rep. of Germany

[73] Assignee: Alcatel N.V., Amsterdam, Netherlands

[21] Appl. No.: 571,994

[22] Filed: Aug. 24, 1990

[30] Foreign Application Priority Data

Sep. 4, 1989 [DE] Fed. Rep. of Germany ....... 3929312

[51] Int. Cl.$^5$ ................................................. H01S 3/19
[52] U.S. Cl. .......................................... 372/46; 372/45
[58] Field of Search ..................................... 372/46, 45

[56] References Cited

U.S. PATENT DOCUMENTS

| | | | |
|---|---|---|---|
| 4,416,012 | 11/1983 | Botez et al. | 312/45 |
| 4,426,700 | 1/1984 | Hirao et al. | 372/46 |
| 4,779,282 | 10/1988 | Ng | 372/46 |

FOREIGN PATENT DOCUMENTS

| | | | |
|---|---|---|---|
| 0087253 | 8/1983 | European Pat. Off. | |
| 0168986 | 7/1986 | Japan | 372/46 |

OTHER PUBLICATIONS

Patent Abstracts of Japan, Band 13, Nr. 38 (E-709), Jan. 27th, 1989; & JP-A-63 236 383 (Hitachi Ltd) Mar. 10, 1988.
Electronics Letters,, Band 22, Nr. 16, Jul. 1986, pp. 869-870, Stevenage, Herts, GB; D. P. Wilt et al.: "Channelled-substrate buried-...".
Patent Abstracts of Japan, Band 10, Nr. 69 (E-389) [2126], Mar. 18th, 1986; & JP-A-60 217 688 (Hitachi Seisakusho K.K.) Oct. 31, 1985.
Appl. Phys. Lett. 48, Jun. 1986 "InGaAsP laser..." N.U. Dutta et al; pp. 15-2-15-3.
Japanese Journal of Applied Physics, Band 25, Nr. 6, part II, Jun. 1986, pp. L435-L436, Tokyo, JP; S. L. Shi et al.: "BH InGaAsp lasers...".
Patent Abstracts of Japan, Band 9, Nr. 220 (E-341), Sep. 6th, 1985; & JP-A-60 080 292 (Matsushita Denki Sangyo K.K.) Aug. 5, 1985.
Applied Physics Letters, Band 40, Nr. 11, Jun. 1982, pp. 942-944, New York, U.S.; W.T. Tsang et al.: "A new lateral...".

*Primary Examiner*—Georgia Y. Epps
*Attorney, Agent, or Firm*—Spencer & Frank

[57] ABSTRACT

In a semiconductor laser having a semi-insulating layer on the sides of a mesa to confine the current to the mesa during operation of the laser, at least one n-type layer and at least one p-type layer are provided above or below the semi-insulating layer.

3 Claims, 1 Drawing Sheet

SEMICONDUCTOR LASER

BACKGROUND OF THE INVENTION

The present invention relates to a semiconductor laser comprising at least one active region and at least one semi-insulating region on a semiconductor substrate, said at least one active region extending over part of the surface of the semiconductor substrate, and said at least one semi-insulating layer being disposed on both sides of the active region.

In Appl. Phys. Lett. 48 (1986), pp. 1572-1573, a DCPBH (double channel planar buried heterostructure) semiconductor laser is described which has four epitaxially grown layers on an n-InP substrate: an n-InP layer serving as a buffer layer and covering the n-InP substrate, an undoped InGaAsP layer serving as an active region, a p-InP layer serving as a waveguide region, and a p-InGaAsP layer serving as a contact layer.

Two parallel channels are etched into the InGaAsP, p-InP, and p-InGaAsP layers, leaving a mesa between them. The channels are filled with a semi-insulating layer which rises up to the level of the surface of the contact layer on the mesa at its sides. Atop the contact layer, the mesa has a metal contact to which a voltage is applied in operation.

Semi-insulating layers are less suited for current confinement than highly doped pn junctions. The latter, however, have a poor high-frequency response because of their high capacitance.

Semi-insulating layers have the disadvantage of becoming conductive at low voltages. Therefore, leakage currents flow during operation of the semiconductor laser.

SUMMARY OF THE INVENTION

It is the object of the invention to provide a semiconductor laser which has a very good high-frequency response and is suitable for high-speed optical communication.

This object is achieved by providing a semiconductor laser of the above kind in which on both sides of the active region, at least one n-type layer and one p-type layer are provided which are superimposed one upon another.

The semiconductor laser according to the invention has the advantage of delivering high output power.

BRIEF DESCRIPTION OF THE DRAWING

Two embodiments of the invention will now be described with reference to the accompanying drawing, in which.

DETAILED DESCRIPTION OF THE PREFERRED EMBODIMENT(S)

Figure 1:
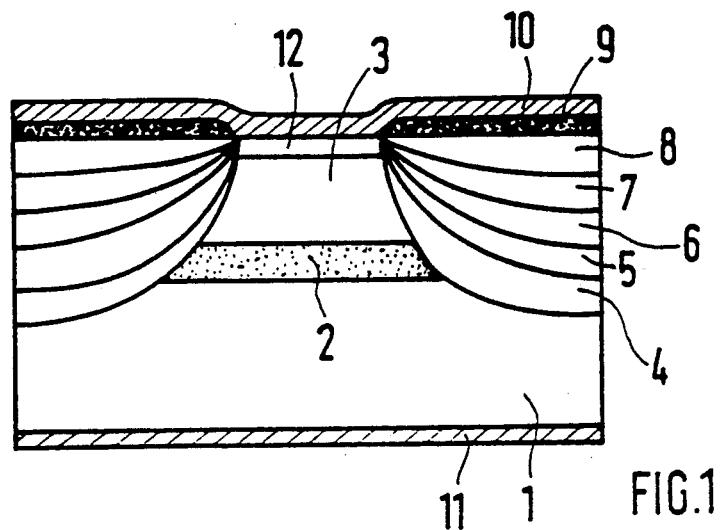
FIG. 1 is a cross section of a semiconductor laser with one semi-insulating layer.

The semiconductor laser shown in FIG. 1 has a semiconductor substrate 1 of either a II-VI compound or a III-V compound, e.g., n-InP. The substrate 1 supports an active region 2 of InGaAsP, over which a waveguide region 3 of p-InP and a contact layer 12 of p-InGaAsP are provided.

The lasers 2, 3, 12 form a mesa which extends in the longitudinal direction of the semiconductor substrate 1.

On the sides of the mesa, several layers of InP lie on top of one another: a semi-insulating layer 4, a p-type layer 5, an n-type layer 6, a p-type layer 7, and an n-type layer 8. The layer 8 and the contact layer 12 form a common planar surface. The layer 8 is covered by a layer 9 of silicon dioxide; the layers 9 and 12 are covered by a metal layer 10, which serves as a contact layer. The underside of the semiconductor substrate 1 is covered by a metal layer 11, which serves as another contact layer.

Figure 2:
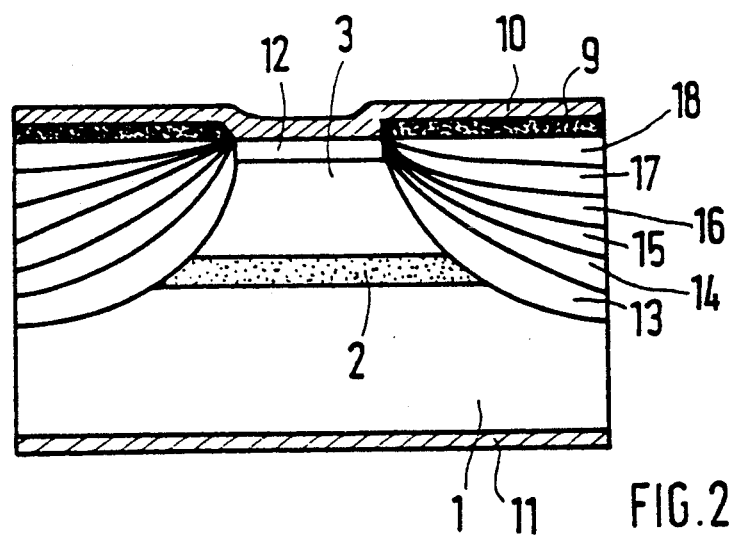
FIG. 2 is a cross section of a semiconductor laser with two semi-insulating layers.

Another embodiment of the semiconductor laser, shown in Fig. 2, has the same layers 1 to 3 and 9 to 12 as the semiconductor laser of FIG. 1.

On the sides of the mesa, a p-type layer 13, an n-type layer 14, a first semi-insulating layer 15, another p-type layer 16, another n-type layer 17, and a second semi-insulating layer 18 are superimposed one upon another.

Other sequences of semi-insulating and n- and p-type layers are also possible. If only a single semi-insulating layer is present, it may be located either below or above the n- and p-type layers.

Semi-insulating and n- and p-type layers lying on top of one another on the sides of an active region are suitable both for BH lasers and for TJS (transverse junction stripe) and CSP (channeled substrate planar) laers.

We claim:

1. In a semiconductor laser, a layer structure comprising: at least one active region and at least one semi-insulating region and a semiconductor substrate, said at least one active region extending over part of the surface of the semiconductor substrate, and said at least one semi-insulating layer being disposed on both sides of the active region, wherein on both sides of the active region at least one n-type layer and one p-type layer are additionally provided upon another adjacent to said at least one semi-insulating layer, said layer structure having two or more pairs of superimposed n- and p-type layers and a single semi-insulating layer.

2. A semiconductor laser layer structure as claimed in claim 1, wherein the n- and p-type layers are located below the semi-insulating layer.

3. In a semiconductor laser, a layer structure comprising: at least one active region and at least one semi-insulating region on a semiconductor substrate, said at least one active region extending over part of the surface of the semiconductor substrate, and said at least one semi-insulating layer being disposed on both sides of the active region, wherein on both sides of the active region at least one n-type layer and one p-type layer are additionally provided one upon another adjacent to said at least one semi-insulating layer, and wherein a silicon-dioxide layer is provided above the n- and p-type layers and the semi-insulating layer a metallic contact layer is provided above the silicon-dioxide layer and the active region, and another metallic contact layer is provided on the underside of the semiconductor substrate.

* * * * *